United States Patent
Sun et al.

(10) Patent No.: US 6,746,539 B2
(45) Date of Patent: Jun. 8, 2004

(54) SCANNING DEPOSITION HEAD FOR DEPOSITING PARTICLES ON A WAFER

(75) Inventors: James J. Sun, New Brighton, MN (US); Benjamin Y. H. Liu, North Oaks, MN (US)

(73) Assignee: MSP Corporation, Shoreview, MN (US)

( * ) Notice: Subject to any disclaimer, the term of this patent is extended or adjusted under 35 U.S.C. 154(b) by 111 days.

(21) Appl. No.: 09/772,694

(22) Filed: Jan. 30, 2001

(65) Prior Publication Data

US 2002/0100424 A1 Aug. 1, 2002

(51) Int. Cl.[7] ............................................... C23C 16/00
(52) U.S. Cl. ..................................................... 118/715
(58) Field of Search ............................ 118/715, 723 E, 118/730, 726, 723 R; 156/345.55, 345.33

(56) References Cited

U.S. PATENT DOCUMENTS

| | | | |
|---|---|---|---|
| 4,284,495 A | 8/1981 | Newton | 209/3.1 |
| 4,301,002 A | 11/1981 | Loo | 209/143 |
| 4,670,135 A | 6/1987 | Marple et al. | 509/143 |
| 4,767,524 A | 8/1988 | Yeh et al. | 209/143 |
| 4,788,082 A | 11/1988 | Schmitt | 427/248.1 |
| 4,886,359 A | 12/1989 | Berndt | 356/312 |
| 4,990,740 A | 2/1991 | Meyer | 219/121.52 |
| 4,996,080 A | 2/1991 | Daraktchiev | 427/57 |
| 5,075,257 A | 12/1991 | Hawk et al. | 437/225 |
| 5,150,036 A | 9/1992 | Pourprix | 324/71.4 |
| 5,171,360 A | 12/1992 | Orme et al. | 75/331 |
| 5,229,171 A | 7/1993 | Donovan et al. | 427/483 |
| 5,306,345 A | 4/1994 | Pellet et al. | 118/301 |
| 5,316,579 A | 5/1994 | McMillan et al. | 118/50 |
| 5,364,562 A | 11/1994 | Wang | 423/593 |
| 5,372,652 A * | 12/1994 | Srikrishnan et al. | 134/21 |
| 5,456,945 A | 10/1995 | McMillan et al. | 427/252 |
| 5,534,309 A * | 7/1996 | Liu | 239/698 |

(List continued on next page.)

FOREIGN PATENT DOCUMENTS

| | | | |
|---|---|---|---|
| EP | 0 712 692 A1 | 5/1996 | |
| JP | 60 190834 A | 2/1986 | |
| JP | 07283180 A * | 10/1995 | H01I/21/304 |
| JP | 09 268379 A | 1/1998 | |
| JP | 11 348297 A | 3/2000 | |
| WO | WO 98/09731 | 3/1998 | |

OTHER PUBLICATIONS

H.H. Zhong et al., "Deposition of superconductive YbaCuo films at atmospheric pressure by RF plasma aerosol technique", AIP Conf. Pro. (219) 1, pp. 531–542.

Q.H. Powell et al., "Gas–phase coating of $TiO_2$ with $SiO_2$ in a continuous flow hot wall aerosol reactor", J.Mat.Res. (12), 2, pp. 552–559.

V. Moshnyaga, "Preparation of rare–earth manganite–oxide thin films by metalorganic aerosol deposition technique", App. Phys. Lett. (74) 19, pp. 2842–2844.

Primary Examiner—Gregory Mills
Assistant Examiner—Michelle Crowell
(74) Attorney, Agent, or Firm—Westman, Champlin & Kelly, P.A.

(57) ABSTRACT

A deposition chamber is formed in a housing that has a substrate carrier on the interior. The substrate carrier is rotatable about a central axis, and a particle deposition head is mounted in the chamber on a support that can be moved linearly along lines that are substantially radial to the central axis of the substrate carrier. The deposition head thus can be moved to different radial positions of a substrate carried on the substrate carrier as the carrier rotates during deposition from the head to provide for a wide variety of deposition patterns on the substrate. The deposition head has a pair of aerosol discharge openings, one being the end of a substantially tubular central passageway and the other being the end of an annular passageway that surrounds the central tubular passageway.

11 Claims, 3 Drawing Sheets

U.S. PATENT DOCUMENTS

| | | | |
|---|---|---|---|
| 5,540,772 A | 7/1996 | McMillan et al. | 118/50 |
| 5,601,235 A * | 2/1997 | Booker et al. | 239/4 |
| 5,614,252 A | 3/1997 | McMillan et al. | 427/99 |
| 5,688,565 A | 11/1997 | McMillan et al. | 427/565 |
| 5,807,435 A | 9/1998 | Poliniak et al. | 118/504 |
| 5,811,020 A | 9/1998 | Alwan | 216/42 |
| 5,916,640 A | 6/1999 | Liu et al. | 427/475 |
| 5,996,528 A * | 12/1999 | Berrian et al. | 118/723 E |
| 6,004,047 A * | 12/1999 | Akimoto et al. | 118/52 |
| 6,066,575 A | 5/2000 | Reardon et al. | 438/782 |
| 6,258,733 B1 * | 7/2001 | Solayappan et al. | 438/785 |
| 6,349,668 B1 * | 2/2002 | Sun et al. | 118/723 R |
| 6,383,948 B1 * | 5/2002 | Kitano et al. | 118/52 |

* cited by examiner

SCANNING DEPOSITION HEAD FOR DEPOSITING PARTICLES ON A WAFER

BACKGROUND OF THE INVENTION

The present invention relates to a deposition head arrangement for depositing particles onto a semiconductor wafer in particular, under a controlled sequence, so that the location, and amount of the particle deposition can be precisely controlled.

In the prior art, it has been known to use an aerosol carrying particles that are deposited onto semiconductor wafers and other substrates in a deposition chamber. The controlling of the density and location of such particles is of great importance, and in many instances it is desirable to deposit individual spots of particles on a wafer as well as providing full coverage of the wafers. It has also been known to apply an electrical charge between a deposition head and the wafer or substrate.

It also has been known to rotate the support tables used in deposition chambers while a thin film material is introduced into the chamber, but in general the rotation has been used primarily for a uniform coating across a wafer that is supported on the table. Such a rotatable device is shown in U.S. Pat. No. 5,688,565 for example.

It is also been known to provide a potential between the deposition head and the support table that supports the wafer, for attracting the particles that are being deposited to the wafer or substrate, in order to insure control the deposition area.

However, precise control of not only the size of the area covered by the particles but also the location of the particles on a wafer is still desired.

SUMMARY OF THE INVENTION

The present invention relates to an aerosol deposition head that can be moved relative to a rotating wafer or substrate in a deposition chamber. The deposition head has two different size discharge openings for discharging particles. The head provides precise sizing of the deposition areas. The rotating support and movable deposition head are controlled to properly place the particles on the substrate.

The apparatus used for the present invention includes a rotating support table for the substrate on which deposition is to be made. The deposition head has a central relatively small tubular discharge opening and a larger annular discharge opening surrounding the central opening. The deposition head is mounted on a support on a deposition chamber and the deposition head will move radially linearly perpendicular to the rotational axis of the substrate carrier. The line of movement of the deposition head is along an axis that intersects the rotational axis of the rotating substrate character.

The present apparatus thus provides for precisely controlling the deposition of particles in desired spots on a substrate, or permits full coverage of the substrate in a uniform layer, or permits irregular patterns to be deposited by controlling the relative rate of rotation of the substrate holder and the linear movement and position of the deposition head while also controlling the flow of the deposition material, both as to the rate of flow and whether the flow is on or off.

DETAILED DESCRIPTION OF THE PREFERRED EMBODIMENTS

Figure 1:
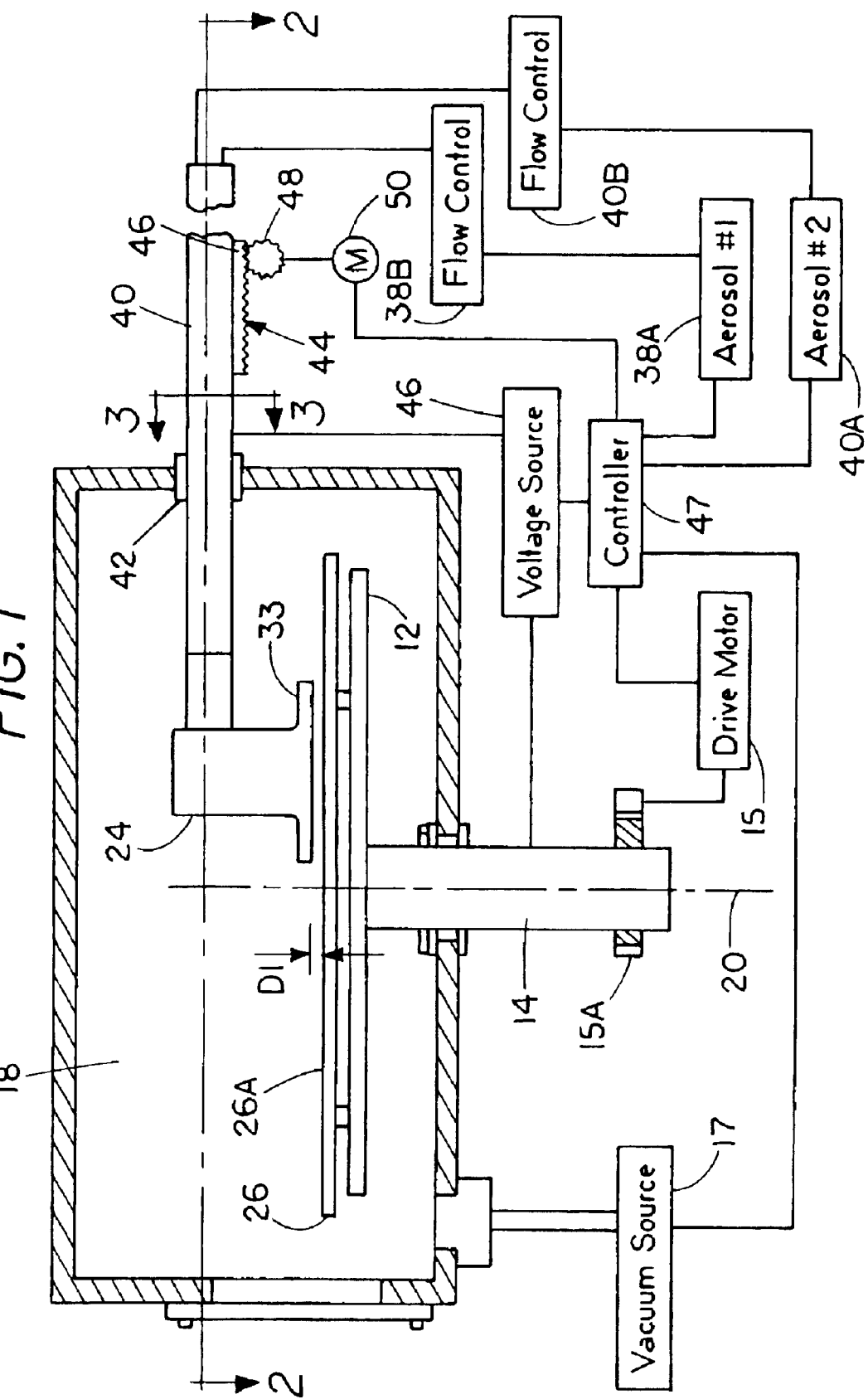
FIG. 1 is a schematic, fragmentary sectional view of a typical deposition chamber having a substrate holder and deposition head made according to the present invention.
Figure 2:
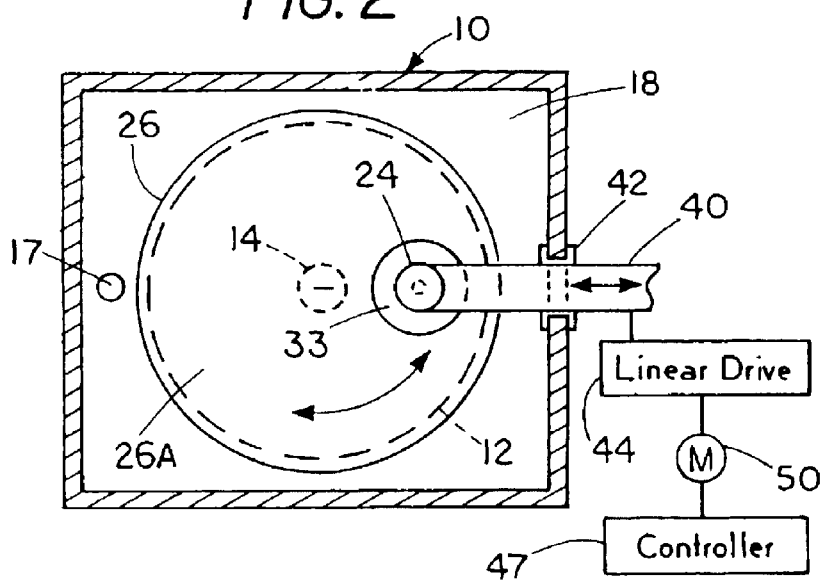
FIG. 2 is a top plan view of the deposition chamber taken along line 2—2 in FIG. 1.

A deposition chamber indicated generally at 10 is provided with an interior substrate carrier 12 which forms a circular table, as shown, in an interior chamber 18 that is under negative pressure from a connected vacuum source 17. The substrate carrier 12 is supported on a rotatable shaft 14, which is driven about an upright axis indicated at 20 using a motor 15, driving through a gear set 15A, as shown. Other types of drives can be utilized for rotating the substrate carrier 12, and the mounting of the shaft 14 can be as desired, but usually it is on bearings and is sealed relative to the interior chamber 18.

The substrate carrier 12 can support a substrate 26 in a suitable manner, so that a deposition head 24 is positioned above the substrate 26. The substrate 26 may be a semiconductor wafer on which particles are to be deposited on the deposition head. The deposition head 24, as shown, has a pair of aerosol passageways forming outlet openings above the substrate, including the open end of a central tube 28 which is relatively small in diameter. The tube opening discharges the aerosol carrying particles to be deposited. The tube 28 is surrounded by an annular passageway 30 defined by an outer wall 32 of the deposition head 24 and the lower end of passageway 30 forms a second particle discharge openings. The interior of the tube 28 is connected to a first inlet portion 34 of the deposition head. The annular passageway 30 is connected to a second inlet portion 36.

Figure 3:
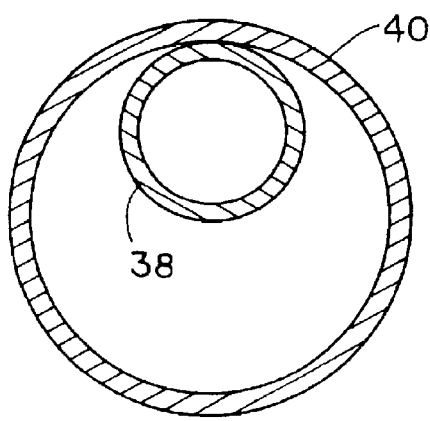
FIG. 3 is a sectional view taken along line 3—3 in FIG. 1.
Figure 5:
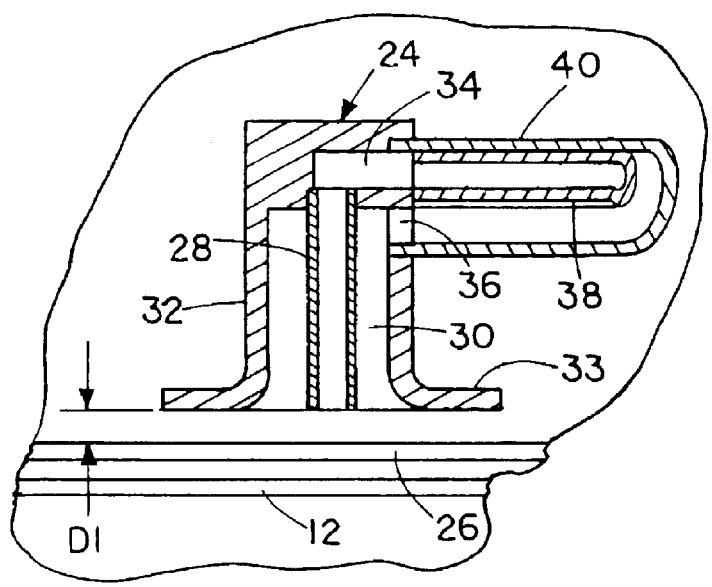
FIG. 5 is a sectional view of the deposition head showing portions of the aerosol delivering tube.

The inlet portion 34 is connected to a tube 38 that is surrounded by a larger tube 40 that opens into the inlet portion 36 (see FIGS. 3 and 5). The tubes 38 and 40 then can be connected to separate aerosol sources 38A, and 40A, respectively. The aerosol sources can have the same size and type of particles therein, or the particle sizes from each of the aerosol sources can be different so each of the passageways will deposit particles having different characteristics.

The outer tube 40 is slidably mounted through a wall of the chamber using seal assembly 42 and is driven axially through a linear drive 44. This drive, as shown, can be a rack 46 driven by a pinion 48. The pinion 48 is driven by a reversible motor 50. Other linear drives can be used.

The deposition head 24 has an outwardly flared edge flange 33 at its lower end, that forms a plane that is parallel to the upper surface 26A of the substrate 26. The flange plane can be spaced from the surface 26A a selected distance indicated at D1 in FIGS. 1 and 5.

A voltage source 46 is connected between the deposition head and the substrate by connecting one terminal of the voltage source to the tube 40 and the other terminal of the voltage source to the mounting shaft 14. The voltage can be a DC voltage that can be in the range of a few volts to about 10,000 volts DC. The voltage level is controlled with a controller 47. The controller 47 also can be used for controlling the drive motor 15, and the drive motor 50. The motors 15 and 50 are controllable as to direction of rotation and speed. Also, if the motors are stepper motors the position of the substrate and the deposition head are known. If DC motors are used, sensors can be used to provide a position feedback for closed loop control.

The controller will be used for controlling the rate of transfer of aerosol materials from the sources 38A and 48A, by regulating flow controllers 38B and 40B in order to provide precise control over the deposition of particles onto the substrate 26, which generally is a semiconductor wafer. Instead of flow controllers, orifice can be used for flow control.

Figure 4:
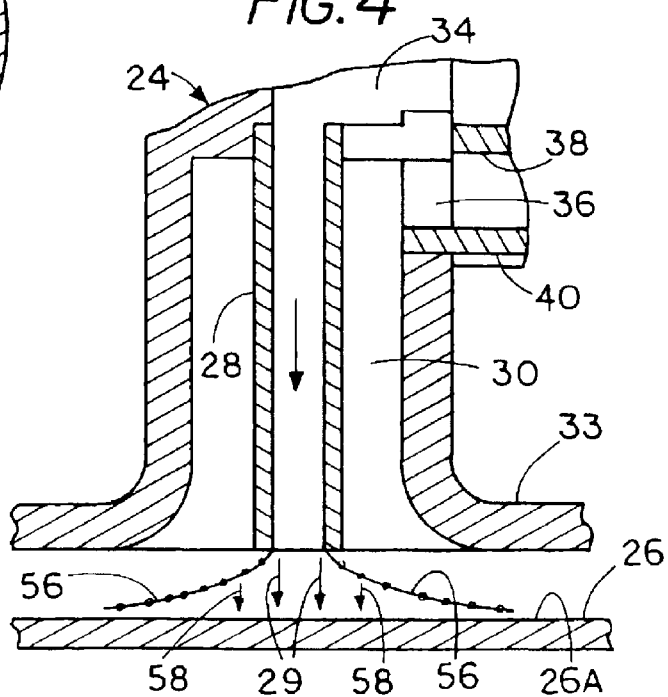
FIG. 4 is an enlarged sectional view of the deposition head and a portion of the substrate.

By way of example, in FIG. 4, a typical flow path of the aerosol from the central tubular section 28 is illustrated, and it can be seen that the gas that carries the aerosol particles will flatten or spread out as the distance from the central axis of the central tube 28 increases. This flow is shown by the flow lines coming from the bottom of the tube. By adjusting the voltage level, the area of particle deposition can be modified. By having the voltage higher, the particles will tend to deposit straight down against the substrate as shown by the center arrows 29. Lowering the voltage causes the particles to tend to be carried out along the flow lines shown at 56, and thus provide a wider deposition line or spot from the tube 28. Intermediate sizes are shown by arrows 58.

Figure 6:
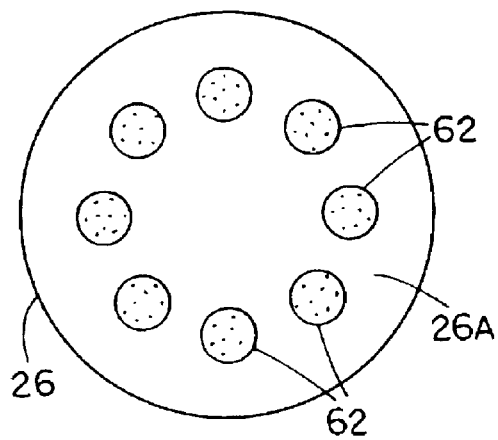
FIG. 6 is a plan view of a wafer having spots of particles deposited.

By operating the controller 47 to rotate the shaft 14 at a selected rate, and then moving the deposition head 24 radially relative to the axis 20 of the shaft 14, the positioning of the deposited particles can be changed significantly. If a series of spots on a substrate or wafer are desired, such as that shown in FIG. 6, the deposition can be started by operating the aerosol source 38A to deposit the desired density of particles. The aerosol source can be shut off and then the substrate carrier can be indexed or rotated to a new position by driving motor 15. Then the aerosol source can be turned back on, so individual spots 62 can be deposited. By controlling the voltage of the voltage source 46 the size of the spots can be controlled as well, and the number of particles actually in the spot will be known when fully controlled. The radial location of the deposited spots can be selected by positioning the deposition head with motor 50.

Figure 7:
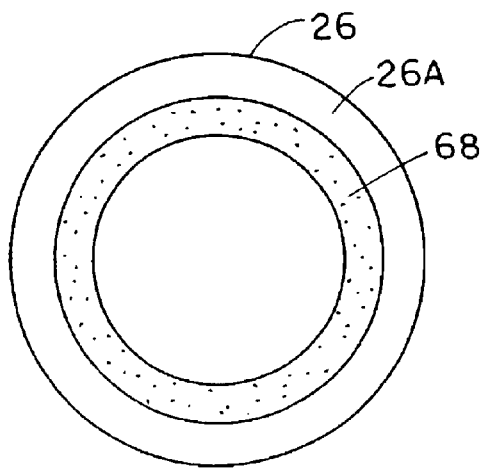
FIG. 7 is a plan view of a wafer having an annular band of particles deposited thereon.

If a narrow ring of particles is desired to be deposited on the wafer as shown in FIG. 7, the aerosol source 38A can be started, and left on continuously while the substrate carrier 12 is rotated by operating drive motor 15, resulting in a line pattern 68 similar to that shown in FIG. 7. Uniform deposition can be obtained for example by operating the aerosol source 40A providing a large area of deposition, and then moving the tube 40 and deposition head 26 radially in at the same time that the substrate is being rotated, to provide a uniform coating all the way to the center of the substrate. Additionally, with narrow deposition bands, and movement in and out of the tube 40 while the substrate is rotated, script can be obtained. Even printing can be made with the particles that are being deposited.

A two coordinate system for moving the deposition head and rotating the substrate, and having two different size deposition openings, greatly enhances the ability to provide deposition patterns that are desired.

Although the present invention has been described with reference to preferred embodiments, workers skilled in the art will recognize that changes may be made in form and detail without departing from the spirit and scope of the invention.

What is claimed is:

1. A chamber in which particles of a selected size carried in an aerosol gas are deposited onto a substrate comprising a housing defining the chamber, a vacuum source connected to the chamber to provide a vacuum in the chamber, a substrate support in said chamber, said substrate support being rotatable about a central axis, a particle deposition head having a sliding support mounted on the housing in the chamber and including a seal for slidably sealing the sliding support on the housing, a source of an aerosol carrying particles which will deposit on the substrate under vacuum, the deposition head having an aerosol outlet and being moveable radially relative to said central axis, and being positioned to overlie the substrate support to discharge particles in the aerosol in a direction toward the substrate support under vacuum in the chamber from the vacuum-source, and a control for selectively controlling the rotation of the substrate support and the radial movement of said deposition head relative to the central axis, said control including means to keep at least one of the deposition head and the substrate support in a stationary fixed position while the solid particles are being deposited on a substrate.

2. The chamber of claim 1, and a source of voltage to establish a voltage differential between the deposition head and the substrate support, and wherein the control includes a controller controlling the source of voltage to vary the voltage to change the area of particle deposition on the substrate support.

3. The chamber of claim 1, wherein said deposition head comprises a head having a first tubular wall forming a first central passageway around a central axis that is parallel to the central axis of the substrate support, and the deposition head having an annular passageway around the first tubular wall.

4. The chamber of claim 3, wherein there is a first source of aerosol connected to the central passageway, and a second source of particles connected to the annular passageway of the deposition head.

5. A particle deposition head for depositing individual solid particles carried in a gas aerosol onto a substrate held in a substrate carrier in a vacuum chamber, a support for the particle deposition head sealingly supporting the deposition head within the chamber, said particle deposition head having a first tubular member in a central portion thereof positioned with an axis of the tubular member overlying the substrate carrier, and an outer housing surrounding the tubular member and being spaced therefrom to form an annular passageway around the first tubular member, and separate connections to separate sources of particle carrying gas aerosol from the first tubular member and from the annular passageway, the particles from the separate sources being discharged from the first tubular member and the annular passageway, respectively, onto the substrate under vacuum.

6. The deposition head of claim 5, wherein said deposition head has a flange at an end thereof that forms a plane perpendicular to the axis of the first tubular member.

7. The particle deposition head of claim 5, wherein the deposition head is mounted onto the support in a deposition housing forming a chamber, a vacuum source connected to the chamber, said support being movable linearly, and a substrate carrier in the chamber rotatable about an axis, with movement of the deposition head and the wafer being controlled by a controller so as to create a substantially uniform number of deposited solid particles per unit area on part or all of the substrate surface.

8. The particle deposition head of claim 7, wherein there is a voltage source connected to at least one of the particle deposition head and the substrate carrier, and a controller for controlling the voltage differential between the particle deposition head and the substrate carrier to permit changing the path of particles that are discharged from the first tubular member and the annular passageway, respectively.

9. The chamber of claim 1, wherein said means for forming a part of said control provides for maintaining the deposition head in a plurality of stationary fixed positions relative to the substrate support, to deposit a spot of particles on a semi-conductor wafer on the substrate support.

10. The chamber of claim 1, wherein the means forming part of the control keeps the deposition head in a stationary fixed position, and causes the substrate support to rotate to deposit a circular band of particles on a substrate.

11. A vacuum deposition chamber for semi-conductor substrate on which particles are to be deposited, a housing having walls defining the chamber, a vacuum source connected to the chamber to provide a vacuum in the chamber for deposition of particles onto the semi-conductor substrate, a substrate support in said chamber for mounting said semi-conductor substrate, said substrate support being rotatable about a central axis, a deposition head positioned within the chamber, a linearly movable support mounting the deposition head on the housing and sealing passing through a wall of the housing, a drive for the linear support on the exterior of the housing, said deposition head being spaced from the semi-conductor substrate when the semi-conductor substrate is supported on the substrate support, a source of an aerosol carrying particles which will deposit on the semi-conductor substrate connected to the deposition head, said deposition head having an aerosol outlet and the linearly movable support being positioned to move the deposition head radially relative to said central axis, said aerosol outlet being positioned to overlie the semi-conductor substrate when supported on the substrate support to deposit particles in the aerosol onto the semi-conductor substrate, and a controller to control the rotation of the substrate support and the drive to provide radial movement of said deposition head relative to said central axis.

* * * * *